United States Patent

Buchanan

[15] 3,676,700

[45] July 11, 1972

[54] INTERFACE CIRCUIT FOR COUPLING BIPOLAR TO FIELD EFFECT TRANSISTORS

[72] Inventor: John K. Buchanan, Tempe, Ariz.

[73] Assignee: Motorola, Inc., Franklin Park, Ill.

[22] Filed: Feb. 10, 1971

[21] Appl. No.: 114,223

[52] U.S. Cl. ...............................307/205, 307/251, 307/279

[51] Int. Cl. .....................................H03k 19/08, H03k 17/60

[58] Field of Search .................................307/205, 251, 279

[56] References Cited

UNITED STATES PATENTS

| | | | |
|---|---|---|---|
| 3,602,732 | 8/1971 | Suzuki | 307/205 |
| 3,284,782 | 11/1966 | Burns | 307/251 X |
| 3,541,353 | 11/1970 | Seelbach et al. | 307/205 X |

OTHER PUBLICATIONS

Electronic Design 26, Nov. 22, 1966 pp. 50– 54 " ICS End the ' Drive Gap' in FET Analog Signal Switching"

*Primary Examiner*—John S. Heyman
*Attorney*—Mueller and Aichele

[57] ABSTRACT

Bipolar and field effect transistors have different threshold voltage and different voltage swings during operation, and furthermore, the threshold voltage for a field effect transistor may be unpredictable when the field effect transistor is applied to a monolithic IC chip. A circuit is disclosed whereby the output of a bipolar transistor circuit such as a logic circuit may drive the input of a large scale integrated field effect transistor circuit, which may involve other logic circuits.

2 Claims, 1 Drawing Figure

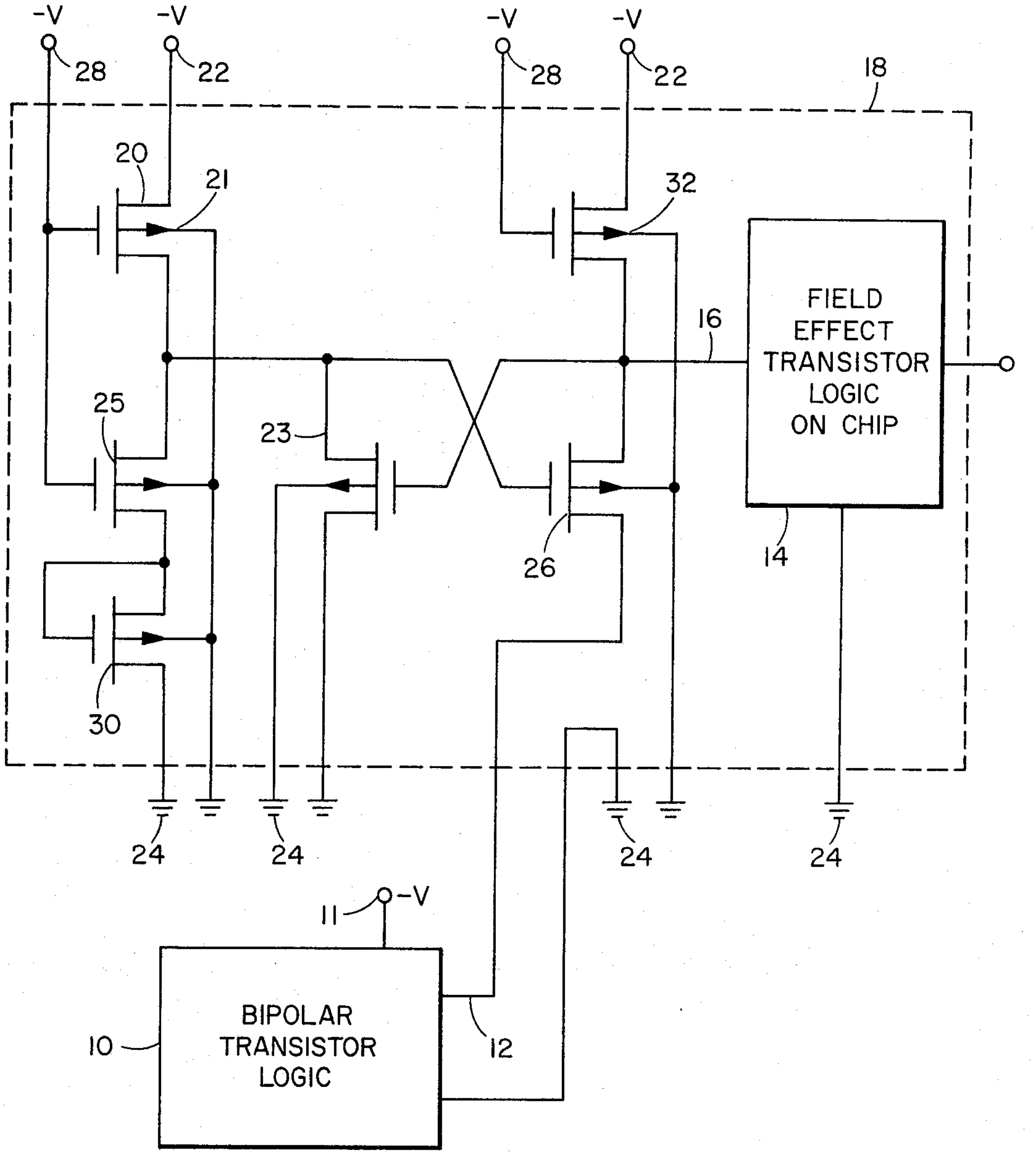
INVENTOR.
John K. Buchanan
BY Mueller & Aichele
ATTY'S

INTERFACE CIRCUIT FOR COUPLING BIPOLAR TO FIELD EFFECT TRANSISTORS

BACKGROUND

This invention relates to an interface circuit by the use of which bipolar T²L transistor circuitry can drive large scale integrated field effect transistor circuitry, the field effect transistors being of the high threshold P-channel type.

It is often desirable to drive field effect transistor circuitry by the output of bipolar transistor circuitry. For example, the output of logic circuitry known as T²L (transistor, transistor logic) or DTL (diode transistor logic) circuits which comprise diodes and bipolar transistors may be coupled to such logic circuits as shift registers or read only memory circuits or random excess memories or many others which may be made with field effect transistors of the high threshold P-channel type. While at this state of the art, when field effect transistors manufactured by using the high threshold P-channel process are put on a chip, their threshold voltage cannot be predicted, the threshold voltage is likely to be minus 3 to minus 5 volts. However, the threshold voltage of all field effect transistors which are deposited on a chip at the same time and by the same method will have the same threshold voltage. Furthermore, to get a logical zero at the drain of a field effect transistor, the voltage applied to the gate thereof must be great enough to substantially turn on the field effect transistor. This voltage may be as much as −8 volts. The voltage swing of the output of the bipolar transistor is between −1 and −4 volts, whereby it cannot drive a field effect transistor circuit and it cannot turn the field effect transistor on.

It is an object of this invention to provide interface circuits by the use of which bipolar transistor circuits can directly drive field effect transistor circuits of the high threshold P-channel type.

It is another object of this invention to provide an interface circuit by the use of which the output swing of a bipolar transistor logic circuit can provide the voltage swing necessary to drive a logic circuit including such field effect transistors.

SUMMARY

In accordance with this invention, an interface circuit is provided on a chip for adding a voltage proportional to the threshold voltage of the field effect transistor which comprises the field effect logic circuit to the voltage swing of the output of the bipolar transistor logic, the circuit also amplifying the swing of the voltage applied to the chip. The field effect transistor logic circuit is also applied to the chip at the same time as the interface circuit and by the same known method, whereby the added threshold voltage is that of the field effect transistors of the field effect transistor logic circuit. The amplifier so amplifies the output logic of the bipolar transistor circuit as to cause proper operation of the field effect transistor logic circuit by the output of the bipolar transistor logic circuit.

DESCRIPTION

The invention will be better understood upon reading the following description in connection with the accompanying drawing, the single FIGURE of which illustrates an embodiment of the interface circuit of this invention.

Turning to the figure, the output voltage of a bipolar logic circuit 10 appears at its output terminal 12. The output of the bipolar logic circuitry 10 appearing at terminal 12 is in reference to the most positive point in the logic circuitry 10, which, as shown, is grounded, whereby negative voltage is applied to the power supply terminal 11 of the circuit 10. Or, if desired to operate the bipolar circuit at a positive voltage, sufficient positive voltage is added to each terminal 11, 24, 22 and 28 so as to make the voltage at terminal 11 equal to zero. In the following explanation, the voltage at the terminal 12 will be referenced to the ground terminal 24. This voltage at the terminal 12 may be in the range of −1 to −4 volts, the −4 being, for bipolar logic circuits, a logical 0 and a −1 being a logical 1. The field effect transistors (not shown) in the field effect logic circuit 14 which is deposited on the chip 18 may have a threshold of −3 to −5 volts. It may require the application of −8 volts to the gates thereof to turn them on sufficiently so they can provide a logical 0 for field effect transistors. Therefore, if the output terminal 12 of the bipolar transistor logic circuit 10 is coupled directly to the input terminal 16 of the field effect transistor circuit 14, the field effect transistor circuit 14 would not respond properly to the voltage applied thereto. The interface circuit is also deposited on the chip 18 whose outline is indicated by the dotted rectangles. The interface circuit to be described comprises field effect transistors, and the logic circuit 14 also comprises field effect transistors, and they are all applied to the face of the chip 18 at the same time and by the same method. Therefore, while the threshold voltage applied to their gates before current can flow between the drains and the sources thereof, cannot be predicted at this state of the art, it is known that all the field effect transistors on the chip 18, including those included in the field effect logic circuit 14, are the same for all practical purposes.

The interface circuit includes a first insulated gate field effect transistor (hereinafter IGFET) 20 whose drain is connected to a terminal 22 of a supply not shown, the other terminal of the supply being connected to ground 24. The substrate 21 of the transistor 20 is connected to ground 24. Since all substrates for all the IGFETs are connected to ground 24, no further mention of this connection need be made. The source of the transistor 20 is connected to the drain of a second IGFET 25 and to the drain of a third IGFET 23 and to the gate of a fourth IGFET 26. The gate of the IGFET 20 is connected to a terminal 28 of a bias source whose other terminal is also connected to ground terminal 24. The source of the IGFET 25 is connected to the drain of a further IGFET 30 whose source is connected to ground 24. The gate of the IGFET 30 is connected directly to its drain.

The source of the IGFET 23 is connected directly to ground 24 and the gate thereof is connected directly to the drain of the IGFET 26. The drain of the IGFET 26 is also connected to the source of an IGFET 32, the drain of which is connected to the terminal 22. The gate of the IGFET 32 is connected to the bias terminal 28. The source of the IGFET 26 is connected to the output terminal 12 of the bipolar logic circuit 10. The other output terminal of the bipolar logic circuit 10 may be connected to ground 24 directly or by way of the chip 18 as shown. The input terminal 16 of the field effect transistor logic circuit 14 which is noted above includes other IGFETs like the IGFETs 20, 23, 25, 26, 30 and 32, are connected between the drain of the IGFET 26 and ground 24.

In operation, the voltage at the terminal 22 may be about −13 volts, and the voltage at the bias terminal 28 may be about −28 volts, whereby the channel of the IGFET 20 exhibits a voltage drop of about 5 volts. The voltage drop across the IGFET 25 is about 2 volts. This difference in voltage is predetermined by fabricating the IGFETs 20 and 25 to exhibit these respective voltage drops. The voltage drop across the IGFET 30 is directly proportional to the threshold voltage of all the IGFETs, whatever they may be on the chip 18, due to the connection of the drain thereof to the source thereof. Therefore, the voltage applied to the gate of the IGFET 26 is equal to the threshold voltage plus about 2 volts negative with respect to ground. The additional two volts is to compensate for the resistance in the circuit whereby the voltage applied to the gate of the IGFET 26 is at least the threshold voltage of the several IGFETs on the chip. The channel of the IGFET 32 acts merely as a load resistor, the resistance of which is determined by the physical structure of the device. The bias voltage applied to the terminal 28 is normally constant. Since the output voltage at terminal 12 of the bipolar transistor logic 10 is applied between the source and ground of the IGFET 26, the IGFET 26 acts as an amplifier of the output of the bipolar logic circuit 10, the voltage swing on the terminal 12 being added to the preestablished voltage applied to the gate of the IGFET 26 by the network which includes IGFETs 20, 25 and 30, and the output voltage of the amplifier 26 appearing at the terminals 16 is great enough and its voltage swing is great enough to properly operate the IGFETs found in the field effect transistor circuit 14.

Up to this point, the function of the IGFET 23 has not been mentioned. If the voltages applied to the terminals 22 and 28 were constant or nearly constant, the IGFET 23 and its connection may be omitted. The IGFET 23 acts to keep the voltage applied to the gate at the IGFET 26 constant although the voltage at the terminals 22 and 28 may vary to a greater extent. This is accomplished as follows. If the voltage at the terminals 22 and 28 goes down, that is becomes more negative, the voltage at the drain of the transistor 26 goes more negative. Since the voltage on the drain of the IGFET 26 and therefore on the gate of the IGFET 23 also becomes more negative, the current flow through the IGFET 23 increases, lowering the voltage on the gate of the IGFET 26, whereby the voltage applied to the gate of the IGFET 26 is decreased. That is, the IGFET 23 acts as a variable regenerative feedback shunt which keeps the gate voltage on the IGFET 26 constant with change of supply and biasing voltage and also speeds up the operation of the described interface circuit since the regenerative shunt varies with supply voltage changes and also varies with signal input changes applied by the logic circuit 10. More specifically the speed of operation that is of importance for a circuit of this type is the reaction and transition time of the voltage at the drain of IGFET 26 in relation to the time at which the input voltage at 12 changes. This transition time can be enhanced by altering the applied reference voltage to the gate of IGFET 26 so that it turns on or off faster because this drive voltage is being appropriately increased or decreased. The IGFET 23 accomplishes this because its gate drive voltage is the drain voltage of IGFET 26 and as that voltage increases transistor 23 turns on harder thereby reducing the gate voltage of transistor 26 causing it to turn off faster which reduces the transition time for that voltage at 16 to reach its highest level. The inverse of this reaction is also enhanced when the transition is from a high voltage on 16 to a low voltage.

While numerical values of supply and operating voltages are mentioned, they are to be considered as typical and not as limiting.

What is claimed is:

1. In combination with a field effect transistor logic array which requires a first level of threshold voltage for driving into conduction the field effect transistor array and, a bipolar transistor driver circuit as a source of first level and second level driving signals which of themselves have a magnitude insufficient to act directly as drive voltage signals for the array, a coupling circuit responsive to said bipolar transistor driver for amplifying the drive voltage supplied by the bipolar transistor logic driver and for applying the amplified drive signals to said field effect transistor logic array, comprising:

a plurality of field effect transistors and each having source, drain, gate and substrate terminals and said plurality of field effect transistors being connected in series arrangement whereby the source of the first is connected to the drain of the next;

a first potential source having a first potential level, a second potential level and a third potential level, and said first potential level being more negative than said second potential level and said third potential level being more negative than said first potential level;

said drain terminal of the first field effect transistor in the series being connected to said first potential level and the source terminal of the last transistor in the series being connected to said second potential level;

certain of said serially connected transistors providing a predetermined voltage drop over each thereof for controlling the operation of the remaining transistors in said series, and the gates of these voltage dropping transistors being connected together and being further connected to said third potential level for biasing said voltage dropping transistor into conduction and for establishing a bias potential at a first junction formed at the connection of the source and drain terminals of said voltage dropping transistor;

the gate terminal of a remaining serially connected transistor being connected to the drain terminal of the same transistor for developing a voltage which is proportional to the threshold voltage of the field effect transistor logic array;

an amplifying field effect transistor having source, drain, gate and substrate terminals, and having its gate terminal connected to said first junction and being responsive to said bias potential, and having its source terminal responsive to the first level drive signal from the bipolar circuit and the second level drive signal from the bipolar circuit;

a field effect transistor having source, drain, gate and substrate terminals and having its drain terminal connected to said first potential level and having its gate terminal connected to said third potential level and having its source terminal connected to said drain terminal of said amplifying transistor at a second junction as the source of amplified driving signals for the field effect transistor logic array;

said amplifying transistor responding to said bias potential on its gate electrode and said first level of driving signals from said bipolar driver to conduct for lowering the voltage at said second junction and generating a disabling logic driving signal, and said amplifying transistor responding to said bias potential on its gate electrode and said second level of driving signals from said bipolar driver to stop conducting for raising the voltage at said second junction and generating a disabling logic driving signal; and said substrate terminals of each of said previously identified field effect transistors being connected to said second voltage level.

2. The combination as recited in claim 1 and further including a feedback field effect transistor having source, drain, gate and substrate terminals and having its drain terminal connected to said first junction and having its gate terminal connected to said second junction and its source terminal connected to said second potential level;

said gate connection operating for sensing a rising voltage at said second junction and causing said feedback transistor to conduct for reducing the bias voltage at said first junction and helping said amplifying transistor to turn off; and said gate connection operating for sensing a dropping voltage at said second junction and causing said feedback transistor to turn off for increasing the bias voltage at said first junction and helping said amplifying transistor to turn on.

* * * * *